(12) United States Patent
Dahlen et al.

(10) Patent No.: US 7,076,618 B2
(45) Date of Patent: Jul. 11, 2006

(54) MEMORY CONTROLLERS WITH INTERLEAVED MIRRORED MEMORY MODES

(75) Inventors: Eric J. Dahlen, Sherwood, OR (US); Warren R. Morrow, Steilacoom, WA (US); Peter D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/181,583

(22) Filed: Jul. 14, 2005

(65) Prior Publication Data

US 2005/0262388 A1 Nov. 24, 2005

Related U.S. Application Data

(62) Division of application No. 10/290,888, filed on Nov. 8, 2002, now Pat. No. 7,017,017.

(51) Int. Cl.
*G06F 12/00* (2006.01)

(52) U.S. Cl. .......................................... 711/157; 711/5
(58) Field of Classification Search ................ 711/114, 711/162, 154, 157, 5
See application file for complete search history.

(56) References Cited

U.S. PATENT DOCUMENTS

| 4,518,947 | A | | 5/1985 | Poston et al. |
| 4,870,643 | A | | 9/1989 | Bultman et al. |
| 5,088,081 | A | | 2/1992 | Farr |
| 5,191,584 | A | | 3/1993 | Anderson |
| 5,367,669 | A | | 11/1994 | Holland et al. |
| 5,579,277 | A | * | 11/1996 | Kelly ..................... 365/230.02 |
| 5,604,662 | A | | 2/1997 | Anderson et al. |
| 5,668,974 | A | * | 9/1997 | Grassi et al. ............... 711/157 |
| 5,724,501 | A | | 3/1998 | Dewey et al. |
| 6,112,257 | A | * | 8/2000 | Mason et al. ............... 711/114 |
| 6,130,853 | A | | 10/2000 | Wang et al. |
| 6,178,135 | B1 | | 1/2001 | Kang |
| 6,219,287 | B1 | | 4/2001 | Sugiyama |
| 6,226,720 | B1 | * | 5/2001 | Henderson et al. ......... 711/157 |
| 6,381,674 | B1 | | 4/2002 | DeKoning et al. |
| 6,393,534 | B1 | | 5/2002 | Chen et al. |
| 6,418,068 | B1 | | 7/2002 | Raynham |

(Continued)

FOREIGN PATENT DOCUMENTS

CN 106 0731 A 4/1992

(Continued)

OTHER PUBLICATIONS

Digital Semiconductor 21172, Core Logic Chipset, Technical Reference Manual, .COPYRGT. Digital Equipment Corporation, Apr. 1996, Ch. 3 pp. 17-27; Ch. 4 pp. 49-61.*

(Continued)

*Primary Examiner*—Pierre-Michel Bataille
(74) *Attorney, Agent, or Firm*—Alan K. Aldous (57) ABSTRACT

In some embodiments, a memory controller includes first and second memory channel interfaces and memory access control circuitry. The memory access control circuitry is to send first and second primary data sections to the first and second memory channel interfaces, respectively, and send first and second redundant data sections to the second and first memory channel interfaces, respectively. The first and second redundant data sections are redundant with respect to the first and second primary data sections, respectively. Other embodiments are described and claimed.

13 Claims, 9 Drawing Sheets

U.S. PATENT DOCUMENTS

| | | | |
|---|---|---|---|
| 6,430,702 B1 | 8/2002 | Santeler et al. | |
| 6,473,339 B1 | 10/2002 | De Ambroggi et al. | |
| 6,567,889 B1 | 5/2003 | DeKoning et al. | |
| 6,574,709 B1 | 6/2003 | Skazinski et al. | |
| 6,681,339 B1 | 1/2004 | McKean et al. | |
| 6,785,835 B1 | 8/2004 | MacLaren et al. | |
| 6,854,070 B1 | 2/2005 | Johnson et al. | |
| 6,877,076 B1* | 4/2005 | Cho et al. | 711/157 |
| 2002/0069317 A1 | 6/2002 | Chow et al. | |
| 2003/0070055 A1 | 4/2003 | Johnson et al. | |
| 2004/0090827 A1 | 5/2004 | Dahlen et al. | |
| 2004/0172508 A1* | 9/2004 | Nguyen et al. | 711/162 |

FOREIGN PATENT DOCUMENTS

| | | |
|---|---|---|
| CN | 106 1865 A | 6/1992 |
| CN | 118 2913 A | 5/1998 |
| EP | 0 755 009 A2 | 1/1997 |
| WO | WO 02/86653 | 10/2002 |

OTHER PUBLICATIONS

Cheung et al. Design and analysis of a gracefully degrading interleaved memory system, IEEE Transactions on Computers, vol. 39(1) (Jan. 1990): 63-71.*

Copy of PCT Search Report dated Nov. 5, 2004 (P15192PCT).

Copy of PCT Search Report dated Nov. 5, 2004 (P14529PCT).

Digital Semiconductor 21172, Core Logic Chipset, Technical Reference Manual, .COPYRGT. Digital Equipment Corporation, Apr. 1996, Ch. 3 pp. 17-27; Ch. 4 pp. 49-61.

Rambus Inc., Direct RDRAM 128/144-MBIT (256K.times.16/18.times.32s), Document DL0059, Version 1.1, pp. 1-66.

Zacharenia Xanthaki "A Memory Controller for Interleavin Over a Single Rambus", www.ics.forth.gr/proj/arch-vlsi/sw_arch/interlRambus.ps.gz, Feb., 1994.

"Preliminary Information, Direct Rambus Memory Controller (RMC2)", www.rambus.com, pp. 1-18, Jul. 2000.

* cited by examiner

MEMORY CONTROLLERS WITH INTERLEAVED MIRRORED MEMORY MODES

RELATED APPLICATION

The present patent application is a divisional of application Ser. No. 10/290,888, filed Nov. 8, 2002, now U.S. Pat. No. 7,017,017.

The present application and application Ser. No. 10/290,889 entitled "Interleaved Mirrored Memory Systems" were filed on the same day, have essentially identical specifications, and claim related subject matter.

BACKGROUND OF THE INVENTION

1. Technical Field

The present inventions relate to memory systems with primary and redundant memory.

2. Background Art

Computer systems typically include memory devices. Dynamic random access memories (DRAMs) are commonly used memory devices that store relatively large amounts of data. Memory controllers issue write requests and read requests to DRAMs. The data to be stored in response to a write request may originate from a processor or another chip. The data provided by the DRAM in response to a read request may be used by the processor or another chip. The memory controller may be in a physically separate chip from the processor or may be on the same chip as the processor.

Computer systems, including server systems, follow a technology trend in which memory subsystems are increasing in both absolute size and in device density. Accompanying the larger memory subsystems is an increasing occurrence of both soft and hard errors in the DRAM devices used to implement the memory subsystem. As the memory subsystem grows, so does the statistical probability of a multi-bit error in any given quantum of data manipulated by the memory controller. In many cases, the memory controller operates on a fixed data size corresponding to a fraction of a cache-line size of the platform processor complex. For example, a memory controller designed for CPUs with a 64 Byte line may store eight 64 bit fragments independently.

Recent server system products have exhibited several features targeted at limiting the system impact of both soft and hard errors in the DRAM memory subsystem. Today, it is common for memory controllers to implement an "Error Correcting Code" (ECC) algorithm, where additional bits of data are stored along with each cache-line fragment, such that any single bit error or combination of bit errors within an aligned nibble may be corrected in hardware. This mechanism permits a system to continue operating reliably in the presence of occasional single-bit soft errors, as well as in the presence of a hard error affecting up to an entire ×4 DRAM device. Extensions on this algorithm are available to protect against failed ×8 DRAM devices. But the ECC mechanism may break down when multiple soft errors are encountered on a single access to the memory store, because the limited correcting code (typically 8 check bits for every 64 data bits, or 16 check bits for every 128 data bits) may not be able to cover all permutations of two or more bit errors scattered across the affected data.

Mirroring data refers to maintaining two copies of every datum in the main memory store. Mirroring every bit of data cuts the effective capacity of a given memory subsystem implementation in half. Known solutions available today also require that the available bandwidth of the memory subsystem be cut in half to provide the mirroring capability.

Figure 1:
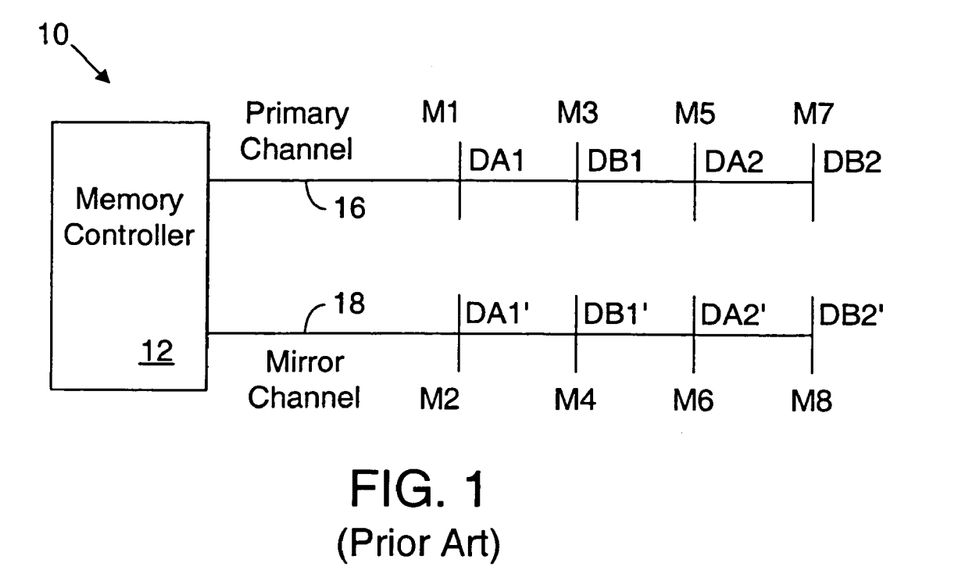
FIG. 1 is a block diagram representation of a prior art memory mirror system.

FIG. 1 provides an example of systems using memory mirroring. In FIG. 1, a system 10 includes a memory controller 12 that is coupled to a primary channel 16 and a mirror channel 18. Memory modules M1, M3, M5 and M7 are coupled to primary channel 16 and memory modules M2, M4, M6, and M8 are coupled to mirror channel 18. Primary data sections DA1, DB1, DA2, and DB2 are provided to memory chips in modules M1, M3, M5, and M7 and redundant data sections DA1', DB1', DA2', and DB2' are provided to memory chips in modules M2, M4, M6, and M8. Note that primary data sections DA1, DB1, DA2, and DB2 are identical or essentially identical to redundant data sections DA1', DB1', DA2', and DB2'.

In another memory system, a memory controller is coupled to a first repeater hub through the primary channel and a second repeater hub through the mirror channel. Two subchannels are coupled to each repeater hub. Memory modules are coupled to the subchannels. Primary dated is stored in the memory modules of the subchannels coupled to the first repeater hub and redundant data is stored in the memory modules of the subchannels coupled to the second repeater hub.

Memory systems with more than two channels have been proposed.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

DETAILED DESCRIPTION

The inventions involve interleaved mirrored memory systems. An interleaved mirrored memory system is a mirrored memory system that typically operates in an interleaved mirrored memory state, but which may temporarily operate in a non-interleaved state in response to the detection of a triggering failure in the memory assembly. A discussion of triggering failures is provided below. When the failure is corrected, the system returns to the interleaved mirrored memory state. Each channel in the system is coupled to one or more memory assemblies. In an interleaved mirrored memory state, the memory of each channel stores both primary and redundant data sections, and corresponding primary and redundant data sections are stored in the memory of different channels.

A memory controller of the system controls the operation of the interleaved mirrored memory state and any non-interleaved states. The memory controller is in an interleaved mirrored memory mode when it is controlling the system in an interleaved mirrored memory state. The memory controller is in a non-interleaved mode when it is controlling the system in a non-interleaved state.

Several examples of systems operating in interleaved mirrored memory states are provided below. Examples of non-interleaved states are also discussed. However, the inventions are not limited to the details of these examples of systems in interleaved and non-interleaved states.

Various types of memory assemblies may be used. Examples of memory assemblies include memory modules and discs or portions of disc in hard drives systems, but the inventions are not so limited. Memory modules each include one or more memory devices. Merely as an example, and not a requirement, memory modules may be 72-bit dual in-line memory (DIMMs) for 64 bits for data and 8 bits for ECC. ECC is not required. The memory devices are not limited to a particular technology. For example, the memory devices may be DRAMs chips manufactured according to currently widely used technology. As another example, the memory devices may be polymer memories. The inventions are not restricted to a particular signaling technique.

The term "data section" refers to data that is stored in a particular memory assembly or a portion of the memory assembly at a particular time. It is intended to be a broad, non-restrictive term. The data section may include data that is physically discontinuous in the memory assembly and that is discontinuous in logical memory. Typically, the contents and extent of the data sections change over time.

A. Examples with One Data Section per Memory Assembly

Figure 2:
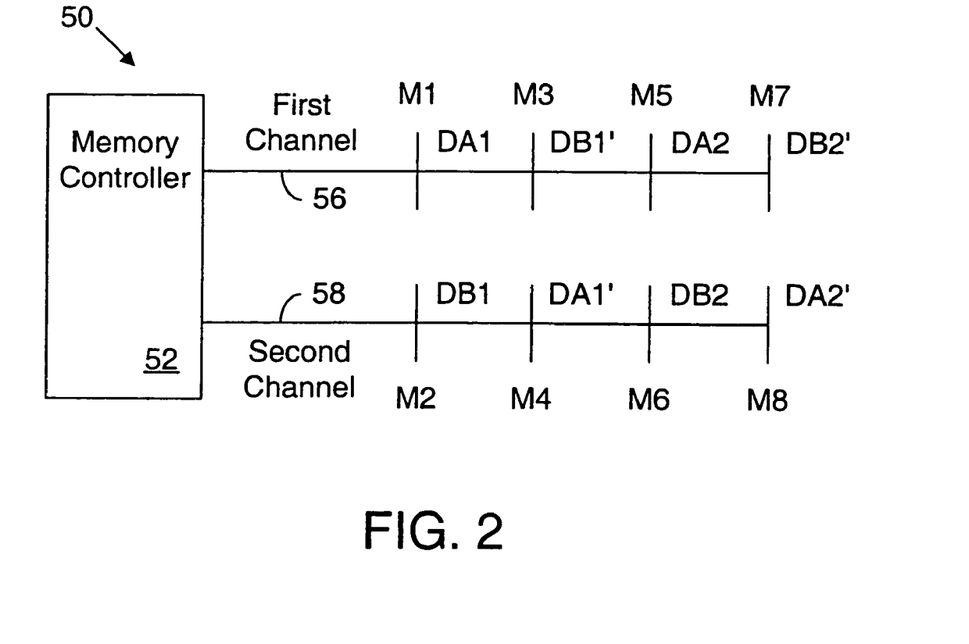
FIGS. 2–4 are block diagram representations of interleaved mirrored memory systems according to some embodiments of the inventions.

FIG. 2 illustrates a system 50, which is an interleaved mirrored memory system. System 50 includes a memory controller 52 coupled to a first channel 56 and a second channel 58. A memory subsystem includes memory assemblies M1, M3, M5, and M7, which are coupled to first channel 56, and memory assemblies M2, M4, M6, and M8, which are coupled to second channel 58. The memory modules may be inserted in slots connected to the channel. When there is failure in a memory module, the failed memory module can be removed from its slot and a properly operating memory module can be inserted into the slot.

Although system 50 and some other systems described herein are illustrated with four memory assemblies per channel, this is not required. There may be more or less than four memory assemblies per channel. In some embodiments, the system will work even though some of the slots that may receive memory modules are empty.

The data to be stored in the memory assemblies is divided into primary data sections DA1, DA2, DB1, and DB2 and corresponding redundant data sections DA1', DA2', DB1', and DB2', which are identical or essentially identical to primary sections DA1, DA2, DB1, and DB2. It is expected that in most if not all actual implementations of the inventions that the redundant data sections would be identical to the corresponding primary data sections (for example, DA1' is identical to DA1). However, a primary and corresponding redundant data section could differ in a known way. For example, the bits in the redundant data sections could be the inverse of the corresponding bits in the primary data sections.

The primary data section is the one that the memory controller ordinarily reads, with the corresponding redundant data section being a backup. In some embodiments, the memory controller always reads the primary data section rather than the corresponding redundant data section if no failure is detected in the system. However, in other embodiments, such as are discussed below, the memory controller may choose to read the redundant data section rather than the primary data section even though there is no failure in the system.

In the illustrated example of FIG. 2, data sections DA1, DB1', DA2, and DB2' are stored in memory assemblies M1, M3, M5, and M7, respectively. Data sections DB1, DA1', DB2, and DA2' are stored memory assemblies M2, M4, M6, and M8, respectively. Accordingly, until there is some failure, system 50 is operating in an interleaved mirrored memory state. In some embodiments, a pair of data sections (for example, DA1 and DB1) form a data group, such that the data sections are each half a data group. Of course, unless the data sections are exceedingly small (such as when the system first starts), only small parts of the data sections will be read or written at a time. For example, in the ordinary course of operation, only a small part of DA1 and a small part of DB1 are concurrently read or written. It is preferred, but not required, that data sections that will be read together be stored in memory assemblies that are the same distance from the memory controller to allow for tighter timing tolerances.

As an example, in some embodiments, the small part of DA1 is a half cache line and the small part of DB1 is a half cache line which together make up a whole cache line. (As an example, the small part of DA1 may be an odd half cache line and the small part of DB1 may be an even half cache line.) An advantage of doing this is that for reads, half of the data group can be read from the first channel at the same time that another half of the data group is read from the second channel. This results in twice the read bandwidth and half the read latency.

In contrast, in prior art system 10, all the primary data sections are on the same channel. Therefore, it will take at least twice as long for data sections DA1 and DB1 to be read through system 10 than through system 50, assuming the controller, channel, and memory chips in systems 10 and 50 otherwise have the same capabilities.

The inventions are not restricted to any particular order of storing primary and redundant data sections with respect to the order of the memory assemblies. For example, in another embodiment, data sections DA1, DA2, DB1', and DB2' may be stored in memory assemblies M1, M3, M5, and M7, respectively, and data sections DB1, DB2, DA1', and DA2' be stored in memory assemblies M2, M4, M6, and M8, respectively. As another example, data sections DB1', DB2', DA1, and DA2 may be stored in memory assemblies M1, M3, M5, and M7, respectively, and data sections DA1', DA2', DB1, and DB2, be stored in memory assemblies M2, M4, M6, and M8, respectively.

In FIG. 2, memory assemblies M1, M2, M3, and M4 might be called the first, second, third, and fourth memory assemblies. This, however, is arbitrary. Any of the memory assemblies could be called the first memory assembly, and any others, the second, third, and fourth memory assemblies. Further, there is no necessary and particular meaning in the labels DA1, DA2, DB1, DB2 etc., except that in some cases, there may be value in reading from DA1 and DB1 together and from DA1 and DB2 together as discussed above.

Primary memory assemblies are those memory assemblies that store only primary data sections; redundant memory assemblies are those memory assemblies that store only redundant data sections; and mixed memory assemblies are those memory assemblies that store both primary and redundant data sections. In FIG. 2, M1, M2, M5, and M6 are primary memory assemblies and M3, M4, M7, and M8 are redundant memory assemblies. In contrast, in prior art system 10, all the primary memory modules are on one channel and all the redundant memory modules are on another channel resulting in greater latency as described.

B. Examples with Two Data Sections per Memory Assembly

Figure 3:
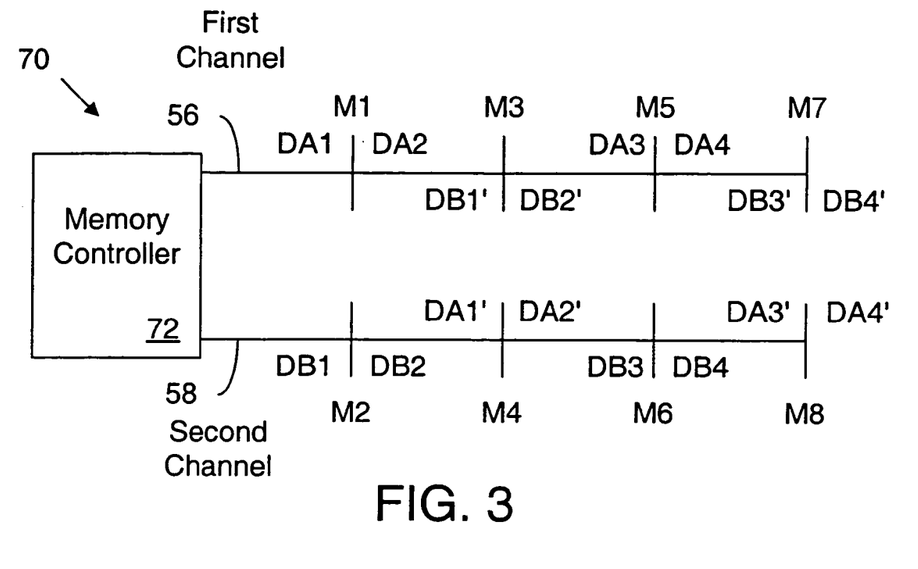

FIG. 3 illustrates a system 70, which is an interleaved mirrored memory system. System 70 includes a memory controller 72 and first and second channels 56 and 58 and memory assemblies M1–M8. Redundant data sections DA1', DA2', DA3', DA4', DB1', DB2', DB3' and DB4' are redundant with respect to corresponding primary data sections DA1, DA2, DA3, DA4, DB1, DB2, DB3 and DB4, respectively.

In the example of FIG. 3, data sections DA1 and DA2 are stored in memory assembly M1, data sections DB1' and DB2' are stored in memory assembly M3, data sections DA3 and DB4 are stored in memory assembly M5, data sections DB3' and DB4' are stored in memory assembly M7, data sections DB1 and DB2 are stored in memory assembly M2, data sections DA1' and DA2' are stored in memory assembly M4, data sections DB3 and DB4 are stored in memory assembly M6, and data sections DA3' and DA4' are stored in memory assembly M8.

Many other orders of data sections with respect to memory assemblies may be used. For example, in another embodiment data sections DA1 and DB1' are stored in memory assembly M1, data sections DA2 and DB2' are stored in memory assembly M3, data sections DA3 and DB3' are stored in memory assembly M5, data sections DA4 and DB4' are stored in memory assembly M7, data sections DB1 and DA1' are stored in memory assembly M2, data sections DB2 and DA2' are stored in memory assembly M4, data sections DB3 and DA3' are stored in memory assembly M6, and data sections DB4 and DA4' are stored in memory assembly M8. In this example, the memory assemblies are mixed, because they have both primary and redundant data.

Figure 4:
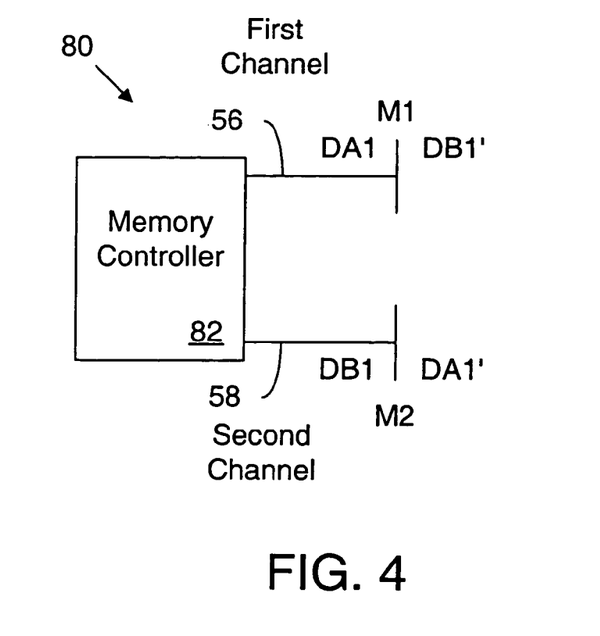

An advantage of having both primary and redundant data on the same memory assembly is that it can be implemented with merely one memory assembly per channel. For, example, FIG. 4 illustrates a system 80, which is an interleaved mirrored memory system and in which there is only one memory assembly per channel. In system 80, a memory controller 82 is coupled to first and second channels 56 and 58 to which memory modules M1 and M2 are coupled, respectively. As illustrated, primary data section DA1 and redundant data section DB1' are stored in memory assembly M1, and primary data section DB1 and redundant data section DA1' are stored in memory assembly M2.

In systems 70 and 80, there are two data sections per memory assembly. The two data sections are in different portions of the memory assembly. There are various ways in which these may be partitioned or distributed into different portions of a memory assembly.

Figure 10:
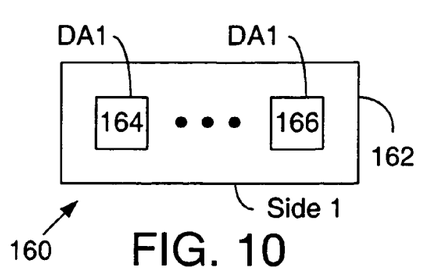
FIG. 10-13 are block diagram representations of memory modules according to some embodiments of the inventions.
Figure 11:
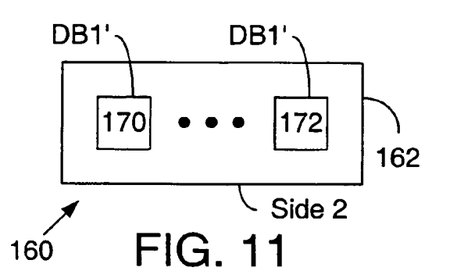

Under some embodiments, some of the chips (or a single chip) of the memory module may hold one data section, while others of the chips (or a single chip) may hold another data section. For example, FIG. 10 illustrates a memory module 160 which includes a printed circuit board (PCB) card 162. Memory chips 164 . . . 166 are on a side 1 of card 162. FIG. 11 illustrates a side 2 of card 162 including memory chips 170 . . . 172. In FIGS. 10 and 11, data sections DA1 is stored in chips 164 . . . 166 and DB1' is stored in chips 170 . . . 172. In this case, the portions holding different data sections are in different groups of chips. The number of chips in chips 164 . . . 166 and in 170 . . . 172 may be one or greater. In some embodiments, there are no chips on side 2. Chips 170 . . . 172 may be on side 1 with chips 164 . . . 166.

Figure 12:
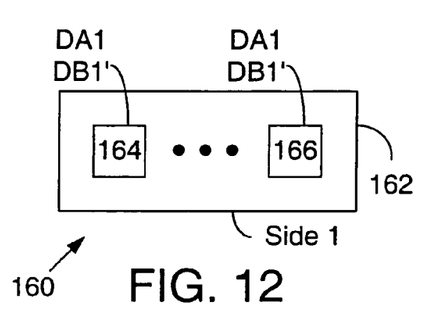
Figure 13:
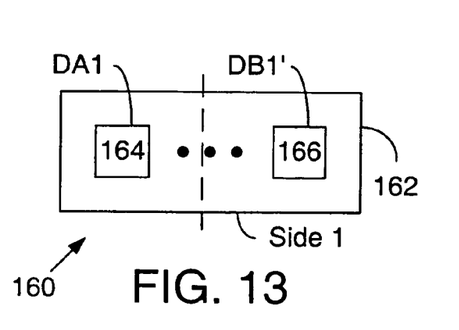

FIG. 12 illustrates two data sections (DA1 and DB1') being stored in each of chips 164 . . . 166. In this case, the portions of the memory assembly holding different data sections are in different parts of each of the chips and distributed through multiple chips. There may be more than two data sections stored in a single chip. Alternatively, in FIG. 13, DA1 is stored in some of chips 164 . . . 166 and DB1' is stored in others of chips 164 . . . 166. In this case, the different portions are in different chips (more like FIGS. 10 and 11 than FIG. 12). In FIG. 13, data sections as shown as being divided into only two groups of chips. However, there may be a greater number of divisions. For example, each chip may include a different data section.

Figure 16:
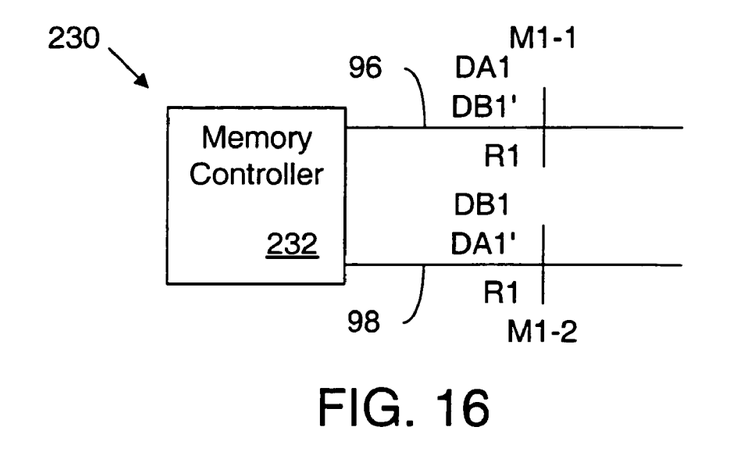

As used herein, the term "rank" refers to those memory devices in a memory assembly that are selected together as a group. That selection may be through a "chip select" contact on the memory chips or through other techniques such as a chip select command multiplexed with other information. In some cases, there is only one rank per memory assembly and in other cases, there are more than one rank per memory assembly. Module 160 may include one, two, or more ranks. The memory assemblies of systems described in this disclosure may have one, two, or more ranks per module, depending on how they are implemented, except where they expressly are limited to a particular number of ranks (for example, FIG. 16 is limited to one rank per memory module).

In some embodiments, the ranks correspond to the portions of the memory modules holding different data sections. For example, in FIGS. 10 and 11, if chips 164 . . . 166 are in one rank and chips 170 . . . 172 are in another rank, then the portions of the memory assembly holding different data sections would correspond to different ranks. In other embodiments, the ranks would not correspond to the portions (for example, in FIG. 12.)

Figure 5:
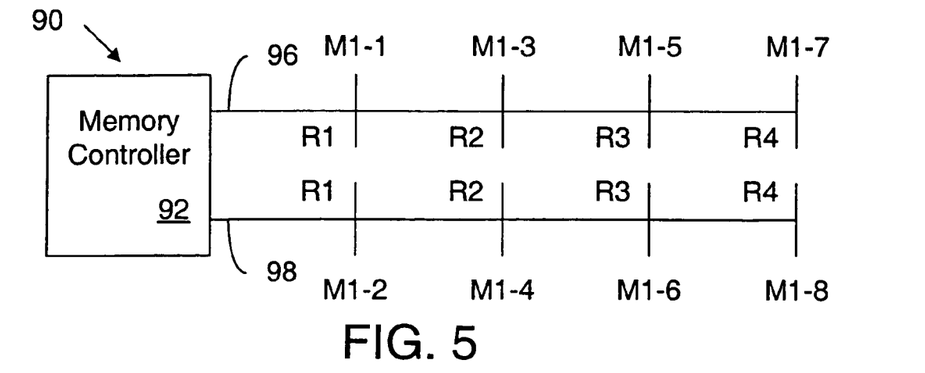
FIGS. 5–8 are block diagram representations of interleaved mirrored memory systems illustrating ranks of the memory assemblies, according to some embodiments of the inventions.
Figure 6:
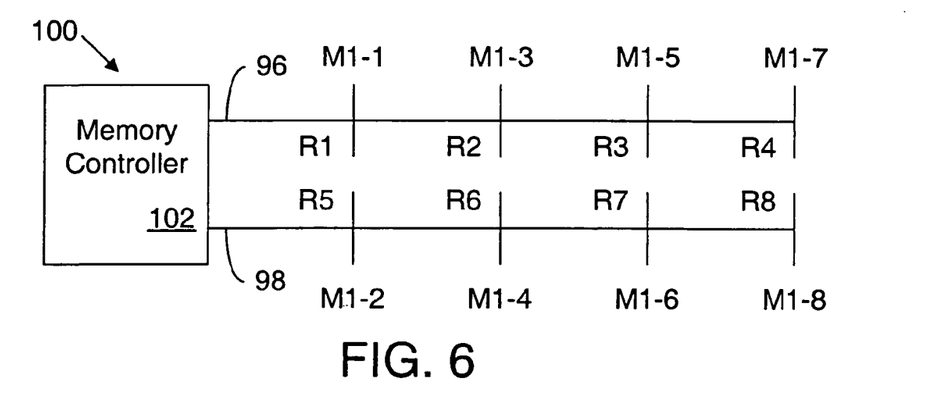

FIGS. 5 and 6 illustrate memory systems with one rank per memory assembly. FIG. 5 illustrates a memory system 90 with a memory controller 92 and first and second channels 96 and 98. FIG. 6 illustrates a memory system 100 with a memory controller 102 and first and second channels 96 and 98. In FIGS. 5 and 6, memory assemblies M1-1, M1-3, M1-5, and M1-7 are coupled to channel 96 and memory assemblies M1-2, M1-4, M1-6, and M1-8 are coupled to channel 98. Memory assemblies M1-1 . . . M1-8 have one rank per memory module. (As mentioned, there may be more or less than four memory assemblies per channel.)

The difference between FIGS. 5 and 6 is that memory controller 92 in FIG. 5 is operating channels 96 and 98 in locked step, whereas memory controller 102 in FIG. 6 is operating channels 96 and 98 independently (not in locked step). When the system is operating in locked step, what is happening to one channel is also happening at the same time to the other channel. In both FIGS. 5 and 6, the ranks of memory assemblies M1-1, M1-3, M1-5, and M1-7 are referred to as ranks R1, R2, R3, and R4, respectively. Likewise, in FIG. 5, the ranks of memory assemblies M1-2, M1-4, M1-6, and M1-8 are also referred to as ranks R1, R2, R3, and R4, respectively, because they are accessed in locked step with ranks R1–R4 of memory assemblies M1-1, M1-3, M1-5, and M1-7. However, in FIG. 6, the ranks of memory assemblies M1-2, M1-4, M1-6, and M1-8 are referred to as ranks R5, R6, R7, and R8, respectively, because they are accessed independently of ranks R1–R4.

Figure 7:
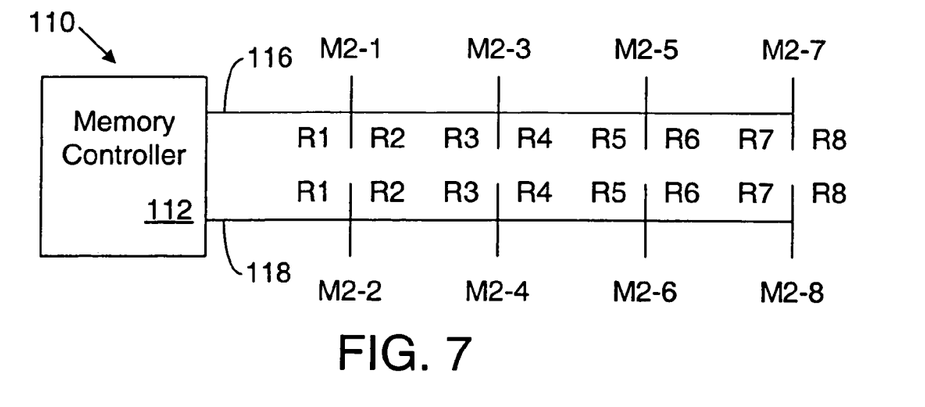
Figure 8:
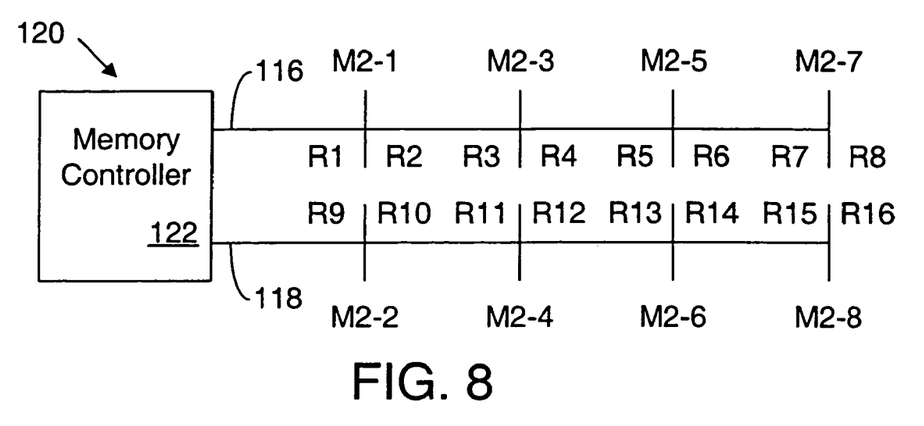

FIGS. 7 and 8 illustrate system 110 and system 120, each of which have memory assemblies having two ranks. Memory controllers 112 and 122 are each coupled to first and second channels 116 and 118. Memory controller 112 of FIG. 7 operates channels 116 and 118 in locked step and memory controller 122 of FIG. 8 operates channels 116 and 118 independently. Memory assemblies M2-1, M2-3, M2-5, and M2-7 are coupled to channel 116 and memory assemblies M2-2, M2-4, M2-6, and M2-8 are coupled to channel 118. In FIGS. 7 and 8, the ranks of memory assembly M2-1 are referred to as R1 and R2, the ranks of memory assembly M2-3 are referred to as R3 and R4, the ranks of memory assembly M2-5 are referred to as R5 and R6, and the ranks of memory assembly M2-7 are referred to as R7 and R8. Likewise, in FIG. 8, the ranks of memory assemblies M2-2, M2-4, M2-6, and M2-8 are also referred to as R1 and R2, R3 and R4, R5 and R6, and R7 and R8, respectively. However, in FIG. 8, the ranks of memory assemblies M2-2, M2-4, M2-6, and M2-8 are referred to as ranks R9 and R10, R11 and R12, R13 and R14, and R15 and R16, respectively, because they are accessed independently of the ranks of channel 116.

Figure 9:
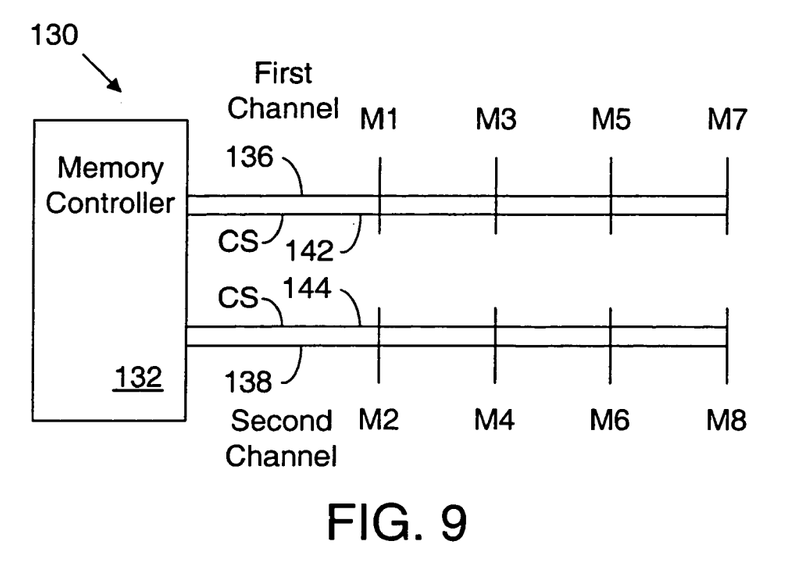
FIG. 9 is a block diagram representation of an interleaved mirrored memory system, illustrating chipset select lines, according to some embodiments of the inventions.

In the case in which the chip select command is multiplexed, it may be carried on the channel. In the case of a separate "chip select" contact on the memory chips, the chip select information may be conveyed over conductors that may be considered part of the channel or separate from it. For example, in FIG. 9, a system 130 includes a memory controller 132 that is coupled to first and second channels 136 and 138, which may represent various channels described herein. Memory assemblies M1, M3, M5, and M7 are coupled to channel 136 and memory assemblies M2, M4, M6, and M8 are coupled to channel 138. Different ones of chip select conductors 142 are coupled to memory assemblies M1, M3, M5, and M7, respectively, and carry chip select signals to them. Different ones of chip select conductors 144 are coupled to memory assemblies M2, M4, M6, and M8, respectively, and carry chip select signals to them. The separate conductors 142 and 144 may be considered part of channels 136 and 138, but are shown separately for illustrative purposes.

Referring again to FIG. 3, chart 1 shows an example of which particular data sections may be stored in each rank in each memory assembly in system 70 in the case in which there are two ranks per memory assembly (as in FIG. 7) and each rank stores only one data section.

CHART 1

| M1, rank R1: DA1 | M2, rank R1: DB1 |
| M1, rank R2: DA2 | M2, rank R2: BB2 |
| M3, rank R3: DB1' | M4, rank R3: DA1' |
| M3, rank R4: DB2' | M4, rank R4: DA2' |
| M5, rank R5: DA3 | M6, rank R5: DB3 |
| M5, rank R6: DA4 | M6, rank R6: DB4 |
| M7, rank R7: DB3' | M8, rank R7: DA3' |
| M7, rank R8: DB4' | M8, rank R8: DA4' |

There are various orders in which the data sections may be stored with respect to order of memory assemblies. For example, chart 2 shows an example of an order of data sections in system 70 (and M1 and M2 of system 80) that is different than that shown in chart 1.

CHART 2

| M1, rank R1: DA1 | M2, rank R1: DB1 |
| M1, rank R2: DB1' | M2, rank R2: DA1' |
| M3, rank R3: DA2 | M4, rank R3: DB2 |
| M3, rank R4: DB2' | M4, rank R4: DA2' |
| M5, rank R5: DA3 | M6, rank R5: DB3 |
| M5, rank R6: DB3' | M6, rank R6: DA3' |
| M7, rank R7: DA4 | M8, rank R7: DB4 |
| M7, rank R8: DB4' | M8, rank R8: DA4' |

As mentioned, in some embodiments, the memory controller may choose to read the redundant data section rather than the primary data section even though there is no failure in the system. An example of a reason to do this is it may be quicker to read from the redundant data section. For example, the desired primary data section may be in a rank that is busy or has just been accessed. In these embodiments, there may be an advantage in having primary and corresponding redundant data sections in different ranks, although there may also be disadvantages for doing this.

Figure 14:
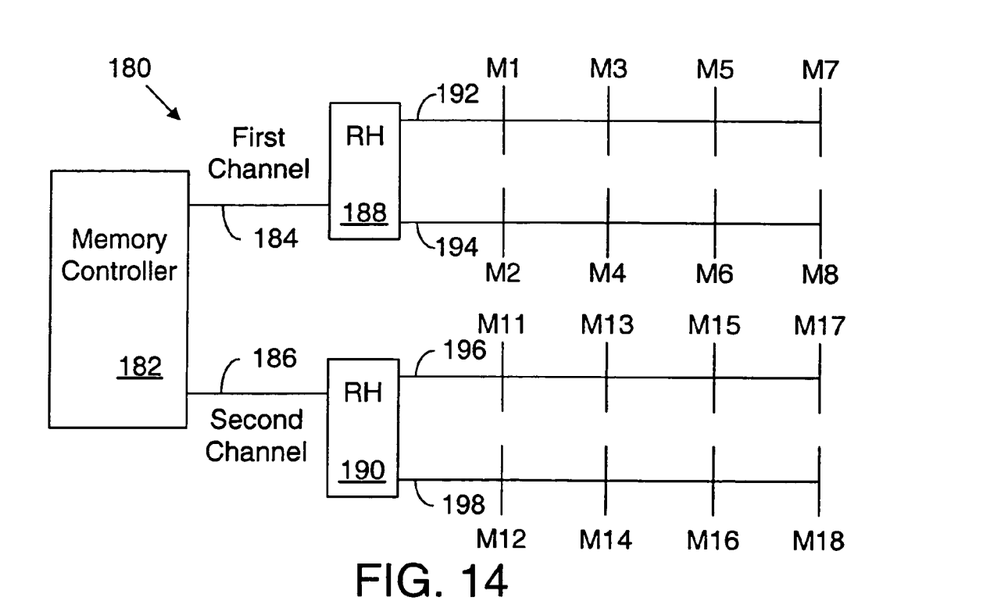
FIGS. 14–18 are block diagram representations of interleaved mirrored memory systems according to some embodiments of the inventions.

FIG. 14 illustrates a system 180, which is an interleaved mirrored memory system. System 180 includes a memory controller 182 that is coupled to a repeater hub 188 through a first channel 184 and a repeater hub 190 through a second channel 186. Subchannels 192 and 194 are coupled to repeater hub 188 and subchannels 196 and 198 are coupled to repeater hub 190. Memory assemblies M1, M3, M5, and M7 are on subchannel 192; assemblies M2, M4, M6, and M8 are on subchannel 194; assemblies M11, M13, M15, and M17 are on subchannel 196; and assemblies M12, M14, M16, and M18 are on subchannel 198. There may be more or less than four memory assemblies on the subchannels. Primary and redundant data sections may be stored as described in other examples in this disclosure. Channels 56 and 58 in FIGS. 3 and 4 are referred to as direct-attach channels because of the direct connection of the channels to the memory controller, whereas subchannels 192, 194, 196, and 198 of FIG. 14 are not direct-attach subchannels because of the intermediate repeater hubs.

Figure 15:
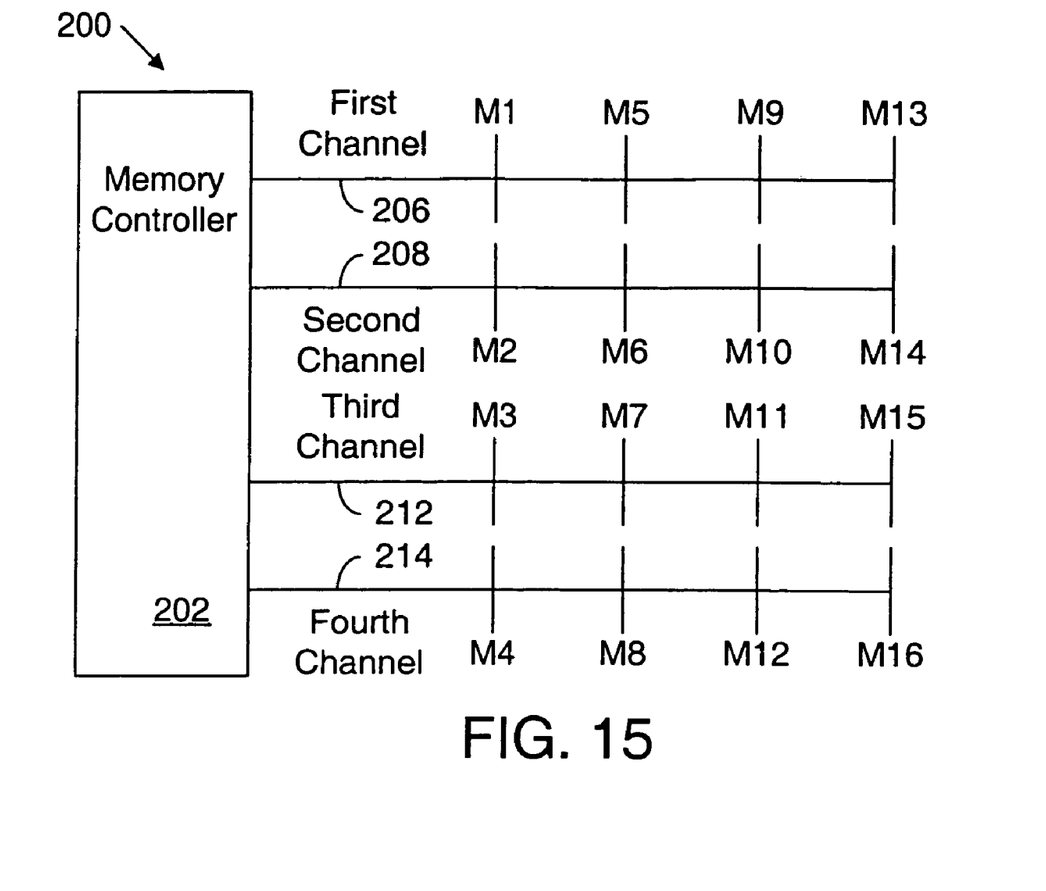

The examples heretofore have been given with systems having two channels. However, the inventions may be implemented with systems having four channels. For example, FIG. 15 show a system 200, which is an interleaved mirrored memory system having a memory controller 202 and first, second, third, and fourth channels 206, 208, 212, and 214. In the example, memory assemblies M1, M5, M9, and M13 are coupled to channel 206, memory assemblies M2, M6, M10, and M14 are coupled to channel 208, memory assemblies M3, M7, M11, and M15 are coupled to channel 212, memory assemblies M4, M8, M12, and M16 are coupled to channel 214. As mentioned, fewer or more than four memory assemblies per channel may be used.

C. Examples with Two Data Sections per Rank

In some embodiments, there are two or more data sections per rank. Such systems may include one or more ranks per memory module. For example, FIG. 16 illustrates a system 230, which is an interleaved mirrored memory system. System 230 includes a memory controller 232 coupled to channels 96 and 98. Memory assemblies M1-1 and M1-2, each have one rank per memory assembly and are coupled to channels 96 and 98, respectively. As an example, data sections DA1 and DB1' are stored in M1-1 and data sections DB1 and DA1' are stored in M1-2. The order within the ranks is not necessarily important. FIG. 16 is shown with channels being in locked step, but the channel control could be independent.

An advantage of using two data sections per rank as in FIG. 16 is that there can be an interleaved mirrored memory system with memory assemblies that have only one rank per module and wherein the system has only one memory assembly per channel. Another advantage is that the inventions can be implemented so that parts of a primary data section and part of a redundant data section (for example, parts of DA1 and DB 1') can be written in different (for example, adjacent) columns of the same page.

Examples of systems with two data sections per rank with more than one rank per assembly are provided below.

D. Examples with More Than Two Data Sections per Memory Assembly

Figure 17:
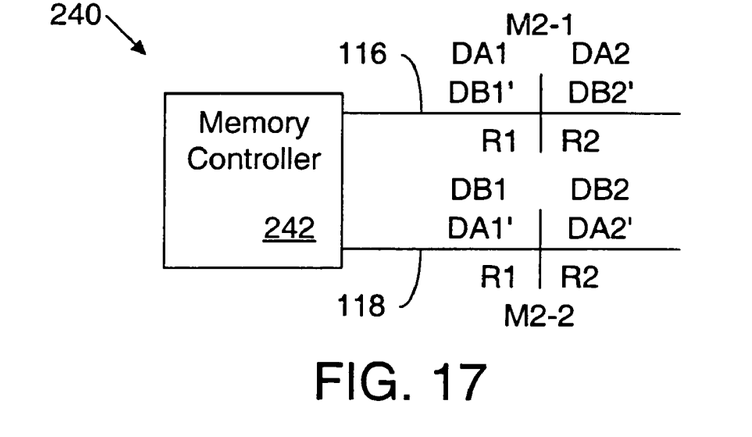

In some embodiments, there are more than two data sections stored in a memory assembly. For example, FIG. 17 illustrates a system 240, which is an interleaved mirrored memory system. System 240 includes a memory controller 242 coupled to channels 116 and 118. Memory assemblies M2-1 and M2-2 are coupled to channels 116 and 118. As an example, data sections DA1, DA2, DB1', and DB2' are stored in memory assembly M2-1 and data sections DA2, DB2, DA2' and DB2' are stored in memory assembly M2-2. are coupled to channel 118. There may be more or less than two memory assemblies per channel.

FIG. 17 is shown with memory assemblies have two ranks per memory assembly, but could have only one or more than two ranks per memory assembly. There are various orders for the data sections, ranks, and memory assemblies. Charts 3 and 4 show examples of which data sections are stored in each rank in each memory assembly. The order of the data sections within the ranks is not necessarily significant.

CHART 3

| M2-1, rank R1: DA1, DB1' | M2-2, rank R1: DB1, DA1' |
| M2-1, rank R2: DA2, DB2' | M2-2, rank R2: DB2, DA2' |

CHART 4

| M2-1, rank R1: DA1, DB2' | M2-2, rank R1: DB1, DA2' |
| M2-1, rank R2: DA2, DB1' | M2-2, rank R2: DB2, DA1' |

Figure 18:
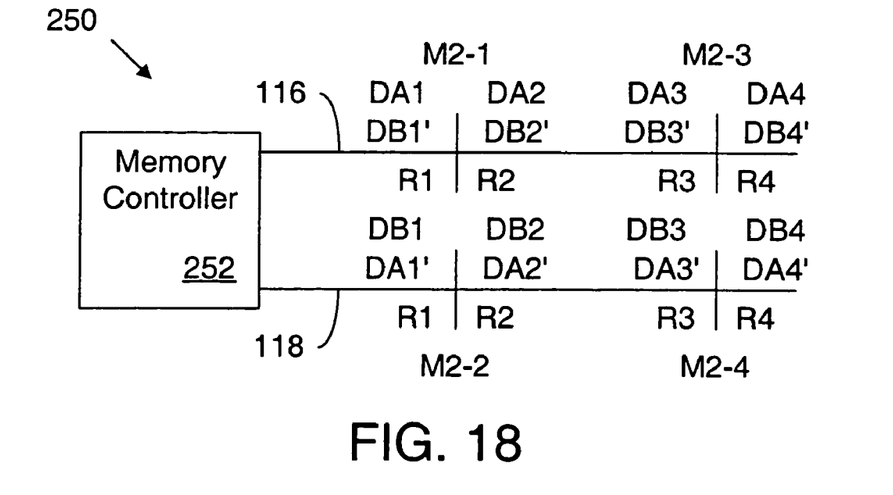

FIG. 18 illustrates a system 250, which an interleaved mirrored memory system, and includes a memory controller 252 coupled to channels 116 and 118. System 250 is like system 240 except that system 250 includes memory assemblies M2-3 and M2-4 to store additional data sections as shown. Additional memory assemblies may be added.

E. Examples of System Details

Figure 19:
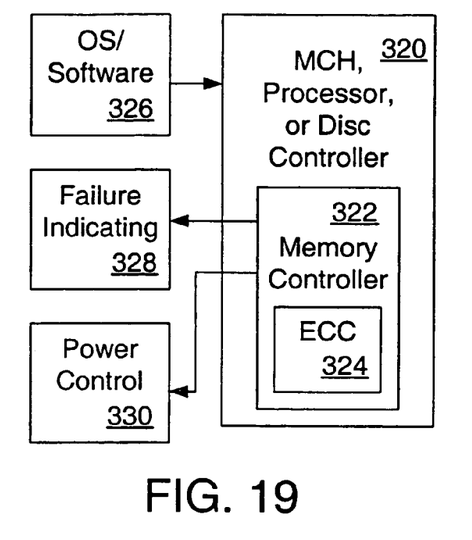
FIG. 19 is a block diagram representation of a system in which a memory controller may be included according to some embodiments of the inventions.

FIG. 19 illustrates details of a system of which a memory controller 322 may be a part, although these details are not required. Memory controller 322 represents various memory controllers described in this disclosure and is included as part of circuitry 320. Examples of circuitry 320 include a memory controller hub (MCH), processor, or disc drive controller. In some embodiments, the processor, memory controller, and memory may be stacked.

ECC circuitry 324 provides ECC control for memory controller 322 and may be part of memory controller 322 or separate from it. ECC control is optional. Operating system (OS) and/or other software 326 provide software control for memory controller 322. Typically, this software control would be indirectly applied to memory controller 322 through various intermediate circuitry. Failure indicating circuitry 328 provides an indication of certain failures in the memory subsystem. Examples of the failure indicating circuitry 328 include circuitry that sends a message to a display indicating the failure of a memory assembly and/or channel. Circuitry that controls a light emitting diode(s) (LED(s)) is another example. Power control circuitry 330 provides power for the memory modules. In some embodiments, when certain failures of the memory subsystem are detected, the power provided to all or some of the memory assemblies of a channel may be shut down. In other embodiments, as described, when certain failures are detected, a user manually removes power. Failure indicating circuitry 328 and power control circuitry 330 are not required. Other techniques may be used for instead. The communication between memory controller 322 and failure indicating circuitry 328 and power control circuitry 330 may be indirect through various intermediate circuits.

Figure 20:
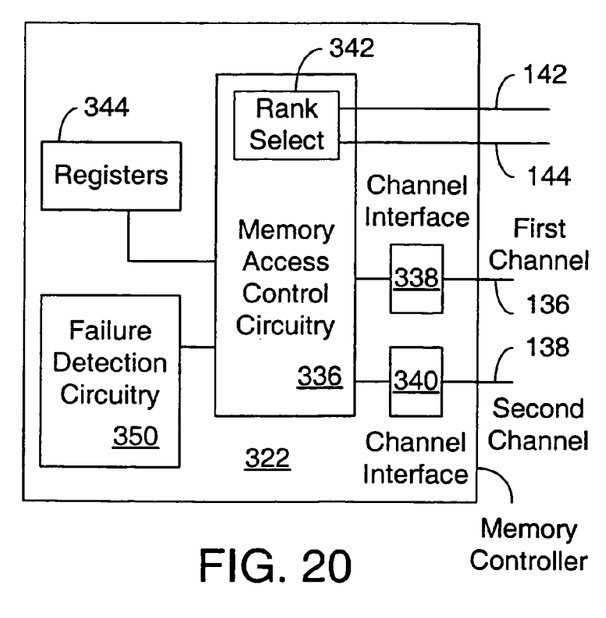
FIG. 20 is a block diagram representation of some details that may be included in a memory controller according to some embodiments of the inventions.
Figure 21:
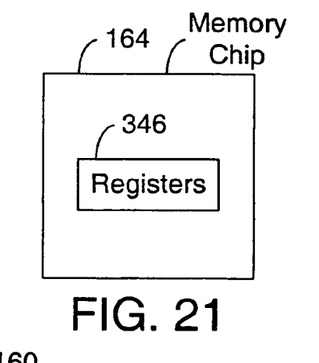
FIG. 21 is a block diagram representation of a memory chip according to some embodiments of the inventions.
Figure 22:
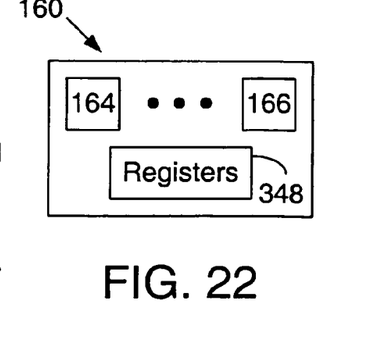
FIG. 22 is a block diagram representation of a memory module according to some embodiments of the inventions.

FIG. 20 illustrates details of some embodiments of memory controller 322. These details are not required for all embodiments. In the example of FIG. 20, memory controller 322 includes memory access control logic 336 which controls reading and writing between the memory controller and the memory assemblies. Along with the memory controller as a whole, memory access control logic 336 ordinarily operates in the interleaved mirrored memory mode, but at times operates in a non-interleaved mode as discussed in this disclosure. First and second channel interfaces 338 and 340 interface between control logic 336 and first and second channels (of which channels 136 and 138 are examples). Memory access control logic 336 selects destinations in the memory assemblies for the data sections to be written to. Memory access control logic 336 includes rank selection circuitry 342 that selects which rank is being accessed. Registers 344 of FIG. 20 and registers 346 and 348 of FIGS. 21 and 22 are discussed below.

Failure detection circuitry 350 detects triggering failures in memory assemblies. Failure detection circuitry 350 also includes circuitry to detect when the failure has been corrected. A triggering failure is one that causes the memory controller to change from interleaved mirrored memory mode to a non-interleaved mode. An example of a triggering failure is when data is lost where the data cannot be recovered without obtaining it from a redundant memory. A correctable failure is one that can be corrected without copying data from redundant memory. A correctable error may be corrected, for example, through ECC codes without leaving the interleaved mirrored memory state. As described below, in some embodiments, several correctable errors in the same memory assembly can be interpreted as a triggering error. Ordinarily, correctable failures will not be detected as triggering failures, but in some embodiments, some correctable failures may be treated as triggering failures. Further, in some embodiments, there could be some failures that are not correctable without replacing a memory assembly and copying data from a non-failed memory assembly that will not be treated as triggering failures. Ideally, there would be no such cases. Causes of triggering failures may include an original or developed defect in a memory assembly, extreme noise, and some soft errors.

Figure 23:
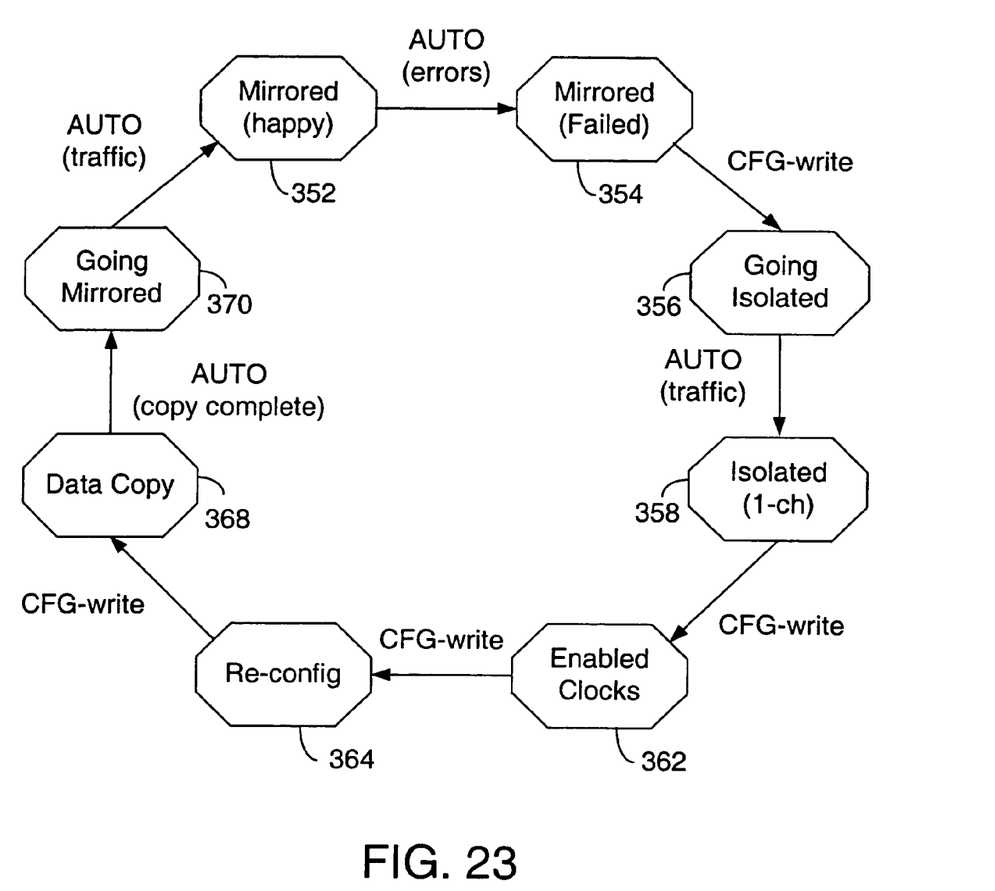
FIG. 23 is a flow diagram of the operation of some embodiments of the inventions.

FIG. 23 is a flowchart illustrating the operation of some embodiments of an interleaved mirrored memory system as shown or described herein. However, the operation of the systems described herein are not limited to these details. In other embodiments, some of the features of the following description of FIG. 23 may be used, while others of the features are not.

Referring to FIG. 23, primary and redundant memory assemblies are initially operating properly (box 352). In some embodiments, hardware tracks the occurrence of ECC errors per memory assembly. Single-error correctable (SEC) errors and double-error detection (DED) errors may be independently tracked. DED errors may designate any of a class of detectable but not correctable bit error combinations. In some embodiments, an error notification occurs in the system if a DED error is encountered, or if a pre-defined number of correctable errors are encountered, but that is not required. The time-based count of SEC errors may be checked against a threshold, which may be programmable. AUTO (errors) refers to hardware detecting an error. A failure may be in a memory module containing primary data, redundant data or both. The channel containing a failed memory module is referred to as a victim channel. The other channel, without a failed memory module, is called the non-victim channel.

When a triggering failure is detected (box 354), for example because an uncorrectable ECC error is encountered, a read is re-issued to the corresponding memory assembly or assemblies. Hardware in memory controller 322 re-assembles the data in the proper order when reads are issued to the non-failed memory assemblies. Hardware will identify the "victim" memory assembly responsible for the triggering failure, and reconfigure dynamically such that data sections in the victim remain or become redundant data sections. If necessary, designation of primary and redundant memory assembly pairs are swapped such that the preferred read destination does not include the victim.

Upon reception of the triggering failure notification, software may place some sort of call for service. In response, a person may notify the machine that a hot-swap event is imminent. The software routine will request fail-down to single-channel operation (box 356), isolating the channel containing the victim memory assembly. Configuration write (CFG-write) is a software action on hardware. The inventions are not limited to using this type of software control. Hardware or other types of software control could be used.

Hardware will sequence the transition from interleaved mirrored memory state operation to single-channel non-interleaved operation, ensuring that no transactions are lost, and that the change in memory configuration remains invisible to compatible software. Memory controller 322 will then electrically isolate the victim channel; disabling all clocking, and tri-stating channel interface signals. Software communicates with the baseboard management controller to remove power from the victim channel. Software notifies the technician that the victim channel has been isolated, and communicates the location of the victim memory assembly. The location of the victim memory assembly may be exposed to software through, for example, the configuration register space of memory controller 322 or associated circuitry (for example, an MCH). Ways in which this may be communicated include a graphical representation sent to the display, or a baseboard controller access to illuminate an LED.

AUTO (traffic) refers to hardware automatically waiting for the traffic on the channel to complete through either finishing or canceling existing operations intended for the memory assemblies. Cancelled operations may be reissued to the non-victim channel.

Once the channel has been isolated (box 358), the technician may swap out the failed memory assembly along with any other memory assemblies on that channel if desired.

Software notifies memory controller 322 through a configuration access to begin bringing the victim channel back on-line, and communicates with the baseboard controller to re-establish power to the victim channel. This sequence of events allows the memory controller to prepare for channel power-up by removing the required interface signals from tri-state (high impedance), and driving the necessary power-up state onto the interface. In some embodiments, memory controller 322 is responsible for driving clock signals used by the memory subsystem, and this reactivates that clocking as well.

Software waits an appropriate interval for power to stabilize and for any subordinate phase locked loop (PLL) and/or delayed locked loop (DLL) circuitry in the memory subsystem to lock, typically a few milliseconds (box 362). At this point, software may utilize the "serial presence detect" mechanism to ensure that the victim slots are populated with the correct technology. If the swapped-in devices do not precisely match the technology in use on the channel still in use, the remainder of the sequence may produce spurious results. It would be possible for software to inform the technician that the devices are unsuitable, as well as precisely what is wrong with them.

Software then moves memory controller 322 into its re-configuring state, and utilizes internal configuration register accesses to restore the operational register settings in the memory assembly on the victim channel (box 364). This stage includes any impedance and timing calibration required prior to utilizing the replaced devices. FIGS. 20, 21, and 22 include registers 344, 346, and 348, respectively. FIG. 21 shows registers 346 in a chip 164. FIG. 22 shows a register 348 on a memory module 160. Registers 346 and 348 may hold configuration information. FIGS. 21 and 22 may be alternatives or complementary. When there is a failure, the information in registers 346 and/or 348 may be lost. That information could be retrieved from the corresponding non-failed memory. However, in some cases, the registers 346 and/or 348 may be read only. In that case, register 344 in FIG. 20 may include that information which can be written to registers 346 and/or 348 of the newly inserted memory assemblies.

Once the victim channel is back up and calibrated, software moves memory controller 322 to its memory copy state, where it will automatically duplicate all of memory onto the channel including the victim memory assembly (box 368). Hardware will detect which channel was the victim such that the proper data interleave is restored by the copy operation.

Hardware will automatically detect when the copy is complete (AUTO (compete)), and dynamically sequence itself back to interleaved mirrored memory state operation with read and write operations once again interleaved across both channels (box 370, AUTO(traffic), and box 352). As mentioned, the inventions are not restricted to the details of FIG. 23.

There are different types of non-interleaved states. For example, in a fully non-interleaved state, the victim channel is completely shut down so that the system is no longer mirrored. In essence, the non-victim channel contains all the data sections and for practical purposes, they are all treated as primary data sections. When power is restored to the victim channel, the data is copied into its memory assemblies and the primary and redundant status of memory sections is reestablished. In a partially non-interleaved state, the victim channel and any memory assemblies therein remain operating except for the failed memory assembly (or assemblies). In that case, the data sections of the memory assembly in the non-victim channel that corresponds to the failed memory assembly remain in or change to primary status until the failure is corrected. In some cases and in some embodiments, the failure may be corrected by merely copying data from the corresponding non-failed memory assembly to the failed memory. In these cases, in this partially non-interleaved state, the victim channel does not have to be shut down as it is in FIG. 23. It may turn out, however, that memory assembly has to be replaced. Variations of these basic types of non-interleaved states may be used. In some embodiments, in response to a failure, redundant memory for a failed memory assembly is recreated and distributed in non-failed memory assemblies on the victim and/or non-victim channel until the failure is corrected. In this way, there continues to be redundant memory until the failure is corrected.

F. ADDITIONAL INFORMATION AND EMBODIMENTS

In each system shown in a figure, the memory controllers each have a different reference number to suggest that the memory controllers represented could be different. However, a memory controller may be flexible enough to have different implementations and work with some or all of the systems shown or described herein. The various channels shown in the figures may be the same or different. Which one is referred to as a first channel and which is called a second channel is arbitrary. The various memory assemblies in a particular system may be identical or different in details.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A memory controller comprising:
   first and second memory channel interfaces; and
   memory access control circuitry to ordinarily send primary and redundant data sections to the first and second memory channel interfaces in an interleaved mirrored memory mode, but at times to operate in a non-interleaved mode.

2. The memory controller of claim 1, further comprising failure detection circuitry to detect memory assembly triggering failures and wherein the memory access control circuitry switches from the interleaved mirrored memory mode to the non-interleaved mode in response to detection of such a triggering failure.

3. The memory controller of claim 2, wherein the memory controller initiates corrective action in response to detection of the triggering failure.

4. The memory controller of claim 3, wherein the corrective action includes initiating a failure indicating message.

5. The memory controller of claim 3, wherein the corrective action includes initiating channel power removal.

6. The memory controller of claim 3, wherein the memory controller further includes registers and wherein the corrective action includes providing contents of the registers to the channel interface associated with the identified channel.

7. The memory controller of claim 3, wherein the corrective action includes identifying one of two channels that is associated with the failure and receiving at least one data section from the other channel and supplying the received at least one data section to the identified channel.

8. A memory controller comprising:
   failure detection circuitry to detect memory assembly triggering failures; and
   memory access control circuitry to ordinarily operate in an interleaved mirrored memory mode and in response to detection of such a triggering failure, the memory access control circuitry switches from an interleaved mirrored memory mode to a non-interleaved mode and after correction of the triggering failure, the memory access control circuitry returns to the interleaved mirrored memory mode.

9. The memory controller of claim 8, wherein the memory controller initiates corrective action in response thereto.

10. The memory controller of claim 9, wherein the corrective action includes initiating a failure indicating message.

11. The memory controller of claim 9, wherein the corrective action includes initiating channel power removal.

12. The memory controller of claim 9, wherein the memory controller further includes registers and wherein the corrective action includes providing contents of the registers to the channel interface associated with the identified channel.

13. The memory controller of claim 9, wherein the corrective action includes identifying one of two channels that is associated with the failure and receiving at least one data section from the other channel and supplying the received at least one data section to the identified channel.

* * * * *